US 6,706,826 B1

(12) United States Patent
Fujiwara et al.

(10) Patent No.: US 6,706,826 B1
(45) Date of Patent: Mar. 16, 2004

(54) COPOLYMER, PROCESS FOR PRODUCING THE SAME, AND RESIST COMPOSITION

(75) Inventors: Tadayuki Fujiwara, Otake (JP); Masayuki Tooyama, Otake (JP); Yukiya Wakisaka, Otake (JP); Koji Nishida, Otake (JP); Akira Yanagase, Nagoya (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 0 days.

(21) Appl. No.: 09/646,117

(22) PCT Filed: Mar. 26, 1999

(86) PCT No.: PCT/JP99/01550

§ 371 (c)(1),
(2), (4) Date: Sep. 27, 2000

(87) PCT Pub. No.: WO99/50322

PCT Pub. Date: Oct. 7, 1999

(30) Foreign Application Priority Data

| Mar. 27, 1998 | (JP) | 10/82186 |
| Mar. 27, 1998 | (JP) | 10/82187 |
| Mar. 27, 1998 | (JP) | 10/82188 |
| Mar. 12, 1999 | (JP) | 11/66615 |

(51) Int. Cl.$^7$ .................................. C08F 2/00
(52) U.S. Cl. .................. 526/79; 526/270; 526/281; 526/319; 526/283; 526/307.7; 526/310; 526/318.4; 430/326; 430/327; 430/330
(58) Field of Search .................. 430/326, 327, 430/330; 526/319, 270, 281, 283, 307.7, 310, 318.44, 79

(56) References Cited

U.S. PATENT DOCUMENTS

| 5,968,713 A | 10/1999 | Nozaki et al. |
| 6,013,416 A | 1/2000 | Nozaki et al. |
| 6,017,680 A | 1/2000 | Hattori et al. |
| 6,214,517 B1 | 4/2001 | Sato et al. |

FOREIGN PATENT DOCUMENTS

| DE | 196 26 003 | 1/1997 |
| EP | 0 722 960 | 7/1996 |
| EP | 0 856 773 | 8/1998 |
| EP | 0 930 542 | 7/1999 |
| JP | 57-141644 | 9/1982 |
| JP | 2-149848 | 6/1990 |
| JP | 5-311110 | 11/1993 |
| JP | 9-73173 | 3/1997 |
| JP | 9-90637 | 4/1997 |
| JP | 10-239846 | 9/1998 |
| JP | 10-274852 | 10/1998 |
| JP | 11-12326 | 1/1999 |
| JP | 11-109627 | 4/1999 |
| JP | 11-119434 | 4/1999 |
| JP | 11-231538 | 8/1999 |

*Primary Examiner*—Tatyana Zalukaeva
(74) *Attorney, Agent, or Firm*—Oblon, Spivak, McClelland, Maier & Neustadt, P.C.

(57) ABSTRACT

The present invention relates to a copolymer for use in paints, resists, and the like; a method for manufacturing the same; and a resist composition using the same. The copolymer according to the present invention is obtained by means of polymerizing at least one monomer containing an alicyclic structure and one monomer containing a lactone structure, and the distribution of the copolymer composition of said monomer containing a lactone structure in said copolymer is in the range of −10 to +10 mol % of the average copolymer composition of said monomer containing a lactone structure in said entire copolymer. In addition, the copolymer according to the present invention is obtained by means of polymerizing a monomer containing an alicyclic structure, a monomer containing a lactone structure, and another vinyl monomer comprising a higher polarity than said monomer containing an alicyclic structure, but a lower polarity than said monomer containing a lactone structure. The copolymer according to the present invention exhibits superior adhesion properties to surfaces possessing a high polarity, such as metal surfaces and the like, in addition to excellent hydrophobic and thermal resistance properties, and also displays a favorable solubility in solvents used for paints, resists, and the like.

18 Claims, No Drawings

COPOLYMER, PROCESS FOR PRODUCING THE SAME, AND RESIST COMPOSITION

TECHNICAL FIELD

The present invention relates to a copolymer, possessing superior adhesion properties with respect to surfaces comprising a high polarity, such as metal surfaces and the like, which effectively imparts both hydrophobic and thermal resistance properties, exhibits a favorable solubility in solvents used for manufacturing paints, resists, and the like, and contains only small amounts of insoluble matter; a manufacturing method for the same; and a resist composition using the same. The present application is based on Japanese Patent Application No. Hei 10-82186, Japanese Patent Application No. Hei 10-82187, Japanese Patent Application No. Hei 10-82188, and Japanese Patent Application No. Hei 11-66615, the contents of which are incorporated herein by reference.

BACKGROUND ART

Hitherto, it is known that a compound possessing a high polarity imparts superior adhesion properties to surfaces possessing an equally high polarity, such as metal surfaces, due to their electrostatic interaction. On the other hand, it is known that a compound possessing a low polarity is superior with respect to its hydrophobic properties; and also that a cyclic compound is superior with respect to the thermal resistance properties imparted.

Thus, in order to provide a paint which exhibits superior adhesion properties to surfaces possessing a high polarity, e.g., metal surfaces and the like, and which can also impart both hydrophobic and thermal resistance properties effectively, a binary copolymer has been proposed, as a resin composition for paints, which is formed by means of polymerizing a monomer comprising a high polarity, and monomer comprising a low polarity, which contains a cyclic structure.

However, when polymerizing monomers comprising significantly different polarities, one of which contains a large cyclic structure, due to the large differences in their monomer reactivity, great difficulty is encountered at the time of attempting random polymerization. Hence, such reactions are likely to yield a copolymer wherein the majority of only one type of monomer component is polymerized during the initial stages of polymerization, followed by polymerization of the majority of the other type of monomer during the later stages of polymerization. As a result, when dissolving such a copolymer in a solvent used for manufacturing solvent paints or resist compositions, due to the solubility of a portion of the copolymer, which the content of the monomer components greatly lies to either of the monomer components, is unfavorable, a insoluble matter in the solvent is generate. This insoluble matter in the solvent, in turn, results in clogging of the filters during the filtration process for paints and the like, and produces an undesirable external appearance for the final coating.

Accordingly, it is an object of the present invention to provide a copolymer obtained by means of polymerizing a monomer comprising a high polarity, which imparts superior adhesion properties to surfaces possessing a high polarity, e.g., metal surfaces and the like; and a monomer comprising a low polarity in addition to cyclic structure, which effectively imparts both hydrophobic and thermal resistance properties; a method for manufacturing the same; and a resist composition using the same. The copolymer of the present invention exhibits a favorable solubility in solvents, and contains only a small amount of insoluble matter, when used for paints or resist compositions.

In addition, another object of the present invention is to provide a resist resin possessing a superior transparency with respect to an ArF excimer laser (at a wavelength of 193 nm).

DISCLOSURE OF INVENTION

In consideration of the aforementioned objects, as a result of intense research with respect to the solubility of various copolymers, the inventors of the present invention have found that it is possible to provide a copolymer obtained by means of polymerizing a monomer comprising a low polarity and a cyclic structure, and a monomer comprising a high polarity, which can exhibit a favorable solubility in solvents for paints, resists, and the like, and which is free of insoluble matter. The aforementioned characteristics are obtained by means of (1) keeping the copolymer composition of said monomer comprising a high polarity, which has varied depending on the copolymer chain, within a specific range approximating the average copolymer composition of said monomer comprising a high polarity in the entire copolymer; (2) adding a monomer comprising a specific polarity to the polymerization; and (3) manufacturing said copolymer according to a particular polymerization method.

In other words, the copolymer according to the present invention is a copolymer obtained by means of polymerizing at least a monomer containing an alicyclic structure, and a monomer containing a lactone structure, wherein the distribution of the copolymer composition of said monomer containing a lactone structure is within −10 to +10 mol % of the average copolymer composition of said monomer containing a lactone structure in the entire copolymer.

In addition, the copolymer according to the present invention is a copolymer obtained by means of polymerizing a monomer containing an alicyclic structure, a monomer containing a lactone structure, and another vinyl monomer, wherein said other vinyl monomer possesses a higher polarity than said monomer containing an alicyclic structure, but a lower polarity than said monomer containing a lactone structure.

In addition, the copolymer according to the present invention preferably possesses a 193 nm light transmittance of 60% or greater when measured at a film thickness of 500 nm.

The method for manufacturing the copolymer according to the present invention is characterized in comprising the step of adding dropwise a mixed solution comprising monomer components containing at least a monomer containing an alicyclic structure, and a monomer containing a lactone structure; a polymerization initiator; and a solvent, to a solvent which has been heated to a polymerization temperature.

Furthermore, the resist composition according to the present invention is characterized in comprising said copolymer according to the present invention.

In addition, said monomer containing an alicyclic structure preferably comprises at least one monomer selected from among the group consisting of cyclohexyl(meth)acrylate, isobornyl(meth)acrylate, adamantyl(meth)acrylate, tricyclodecanyl(meth)acrylate, dicyclopentadienyl(meth)acrylate, and substitution products thereof.

In addition, said monomer containing a lactone structure preferably comprises at least one monomer selected from among the group consisting of substituted and unsubstituted (meth)acrylates containing a δ-valerolactone ring, and substituted and unsubstituted monomers containing a γ-butyrolactone ring.

The copolymer according to the present invention exhibits superior adhesion properties to surfaces possessing a high polarity, such as metal surfaces and the like, in addition to excellent hydrophobic and thermal resistance properties, and also displays a favorable solubility in solvents used for paints, and resists, and the like.

In addition, the copolymer possessing a 193 nm light transmittance of 60% or greater, measured at a film thickness of 500 nm, exhibits a superior transparency with respect to an ArF excimer laser (with a wavelength of 193 nm), and thus is preferred as an ArF resist resin.

In addition, by means of using said monomer containing a particular alicyclic structure, it is possible to improve both the hydrophobic and thermal resistance properties of the copolymer.

In addition, by means of using said monomer containing a particular lactone structure, it is possible to improve the adhesion properties of the copolymer.

In addition, according to the method for manufacturing the copolymer of the present invention, it is possible to provide a copolymer which exhibits superior adhesion properties to surfaces possessing a high polarity, such as metal surfaces and the like, in addition to excellent hydrophobic and thermal resistance properties, and also exhibits a favorable solubility in solvents used for paints, resists, and the like.

In addition, the resist composition according to the present invention is superior with respect to uniformity, sensitivity, and resolution.

BEST MODE FOR CARRYING OUT THE INVENTION

In the following, the present invention is described in detail.

The present invention relates to a copolymer obtained by means of polymerizing at least a monomer containing an alicyclic structure, and a monomer containing a lactone structure.

The aforementioned monomer containing an alicyclic structure imparts both hydrophobic and thermal resistance properties to the copolymer obtained by means of polymerizing the aforementioned monomer, and resin composition thereof.

The monomer containing an alicyclic structure is not particularly limited, however, preferred examples, due to their superior hydrophobic and thermal resistance properties, include at least one monomer selected from among the group consisting of cyclohexyl(meth)acrylate, isobornyl(meth)acrylate, adamantyl(meth)acrylate, tricyclodecanyl(meth)acrylate, dicyclopentadienyl(meth)acrylate, and substitution products thereof. Concrete examples may include 1-isobonyl methacrylate, 2-methacryloyloxy-2-methyl adamantane, cyclohexyl methacrylate, adamantyl methacrylate, tricyclodecanyl methacrylate, dicyclopentadienyl methacrylate, and the like. The aforementioned may be used alone, or in combinations of two or more, as necessary.

The usage amount of the monomer containing an alicyclic structure is preferably in the range of 10 to 90 mol %, and more preferably in the range, of 40 to 60 mol %, with respect to the total monomer component. A higher proportional content of the monomer containing an alicyclic structure results in greater improvement of both the hydrophobic and thermal resistance properties of the resultant copolymer and resin composition thereof. On the other hand, a lower proportional content of the monomer containing an alicyclic structure results in greater improvement of the adhesion properties imparted by means of the undermentioned monomer containing a lactone structure.

The monomer containing a lactone structure provides adhesion properties with respect to surfaces comprising a high polarity, such as metal surfaces and the like, to the copolymer obtained by means of polymerizing said monomer, and the resin composition thereof.

The monomer containing a lactone structure is not particularly limited, however, preferred examples, due to their superior adhesion properties, include at least one monomer selected from among the group consisting of substituted and unsubstituted (meth)acrylate containing a δ-valerolactone ring, and substituted and unsubstituted monomers containing a γ-butyrolactone ring. In particular, unsubstituted monomers containing a γ-butyrolactone ring are preferably used. Concrete examples may include β-methacryloyloxy-β-methyl-δ-valerolactone, 4,4-dimethyl-2-methylene-γ-butyrolactone, β-methacryloyloxy-γ-butyrolactone, β-methacryloyloxy-β-methyl-γ-butyrolactone, α-methacryloyloxy-γ-butyrolactone, 2-(1-methacryloyloxy) ethyl-4-butanolide, pantoyllactone methacrylate, and the like. In addition, examples of the monomer with a similar structure may include methacryloyloxy succinic anhydride, and the like. The aforementioned may be used alone, or in combinations of two or more, as necessary.

The usage amount of the aforementioned monomer containing a lactone structure is preferably in the range of 10 to 90 mol %, and more preferably 40 to 60 mol %, with respect to the total monomer component. A higher proportional content of the monomer containing a lactone structure results in greater improvement of the adhesion properties of the resultant copolymer and resin composition thereof. On the other hand, a lower proportional content of the monomer containing a lactone structure results in greater improvement of both the hydrophobic and thermal resistance properties imparted by means of the monomer containing an alicyclic structure described above.

According to the present invention, besides the aforementioned monomer containing an alicyclic structure and monomer containing a lactone structure, vinyl monomers, which may be polymerized with these aforementioned monomers, may also be used (hereinafter, referred to as "other vinyl monomers").

Examples of these other vinyl monomers include (meth)acrylate esters containing a straight- or branched-chain structure. Concrete examples may include (meth)acrylate esters such as methyl(meth)acrylate, ethyl(meth)acrylate, 2-ethylhexyl(meth)acrylate, n-propyl(meth)acrylate, i-propyl(meth)acrylate, n-butyl(meth)acrylate, i-butyl(meth)acrylate, t-butyl(meth)acrylate, methoxyethyl(meth)acrylate, ethoxyethyl(meth)acrylate, n-propoxyethyl(meth)acrylate, i-propoxyethyl(meth)acrylate, n-butoxyethyl(meth)acrylate, i-butoxyethyl(meth)acrylate, t-butoxyethyl(meth)acrylate, and the like; aromatic alkenyl compounds such as styrene, α-methylstyrene, vinyltoluene, and the like; vinyl cyanide compounds such as acrylonitrile, methacrylonitrile, and the like; unsaturated carboxylic acids such as acrylic acid, methacylic acid, maleic acid, maleic anhydride, and the like; acryl amide; vinyl chloride; ethylene; and the like. The aforementioned may be used alone, or in combinations of two or more, as necessary.

The other vinyl monomer may be incorporated in a manner such that the adhesion, water resistance, and thermal resistance properties of the resultant copolymers are not lost; the usage amount is preferably no greater than 40 mol % with respect to the total monomer component.

According to the present invention, the distribution of the copolymer composition of the monomer containing a lactone structure in the copolymer is preferably in the range of −10 to +10 mol % of the average copolymer composition (referred to as X, in mol %) of the monomer containing a lactone structure, which lie in the range of (X−10) to (X+10) mol %. If the distribution of the copolymer composition of the monomer containing a lactone structure in the copolymer exceeds the aforementioned range, the solubility in solvents used for manufacturing paints, and the like, deteriorates, and the amount of insoluble matter undesirably increases.

In addition, the resist composition for manufacturing semiconductors, using the copolymer wherein the distribution of the copolymer composition of the monomer containing a lactone structure is in the range of −10 to +10 mol % of the average copolymer composition, exhibits high sensitivity and resolution as a resist, due to its higher uniformity.

When using a copolymer for a paint wherein the distribution of the copolymer composition of the monomer containing a lactone structure is in the range of −10 to +10 mol % of the average copolymer composition, the average copolymer composition of the monomer containing a lactone structure in the entire copolymer is preferably in the range of 40 to 60 mol %. An average copolymer composition of the monomer containing a lactone structure in the aforementioned range leads to an appropriate balance between the resultant adhesion properties to metal surfaces, and hydrophobic and thermal resistance properties.

In addition, when using the copolymer for a resist composition for manufacturing semiconductors, the average copolymer composition of the monomer containing a lactone structure is preferably in the range of 40 to 60 mol %. Increasing the average copolymer composition results in greater improvement of the adhesion properties to substrate surfaces, which in turn results in similar improvement of the resolution as a resist. On the other hand, decreasing the average copolymer composition results in an increase in the relative amount of the monomer containing an alicyclic structure, and thus improves the resistance to dry etching as a resist.

The reasons for incorporating a copolymer composition distribution of the monomer(s) containing a lactone structure preferably in the range of −10~+10 mol % of the average copolymer composition is as follows.

The monomer containing an alicyclic structure and monomer containing a lactone structure greatly differ with respect to their polarities and monomer reactivity. Accordingly, in general, it is extremely difficult to conduct random polymerization of the aforementioned monomers. In particular, when conducting batch polymerization, the copolymer composition of the monomers in the resultant copolymer greatly lies to either of the monomers at the initial stages and the later stages of polymerization (i.e., the conversion). On the other hand, the solvents used for manufacturing paints, or resist compositions, are selected according to the average composition ratio of the monomer prepared when synthesizing the copolymer. Thus, a copolymer in which the copolymer composition of the monomers greatly lies to either of the monomers, as described above, is assumed to exhibit an inferior solubility in the aforementioned solvent.

The value of the average copolymer composition of the monomer containing a lactone structure in the entire copolymer according to the present invention is obtained by means of measuring $^1$H-NMR of the copolymer, and then calculating the average copolymer composition from the ratio of the particular $^1$H signal intensity. The average copolymer composition obtained by means of measuring $^1$H-NMR as described in the aforementioned is almost equivalent to the ratio of the monomer prepared when manufacturing the copolymer.

The distribution of the copolymer composition of the monomer containing a lactone structure in the copolymer according to the present invention displays the degree to which the copolymer composition of the aforementioned monomer, containing a lactone structure in each copolymer chain, deviates from the average copolymer composition obtained by means of measuring $^1$H-NMR as aforementioned.

The distribution of the copolymer composition of the monomer containing a lactone structure in the copolymer according to the present invention is measured by means of separating the copolymer solution into 10 to several scores of fractions, using gel permeation chromatography (GPC), measuring $^1$H-NMR of each fraction, and calculating the copolymer composition of the monomer containing a lactone structure of each fraction.

The copolymer according to the present invention may comprise a copolymer obtained by means of polymerizing the other vinyl monomer in addition to the monomer containing an alicyclic structure and the monomer containing a lactone structure, as described in the aforementioned. In such a case, the other vinyl monomer is preferably a vinyl monomer comprising a higher polarity than the monomer containing an alicyclic structure, but a lower polarity than the monomer containing a lactone structure (hereinafter, referred to as "other vinyl monomer comprising an intermediate polarity"). By means of polymerizing a monomer containing an alicyclic structure, a monomer containing a lactone structure, and the other vinyl monomer comprising an intermediate polarity, it is possible to reduce the difference of content ratio of these monomer components in the copolymer obtained at the initial stages and the later stages of polymerization. Accordingly, it is possible to improve the solubility of the copolymer, and thereby reduce the amount of insoluble matter in the solvent.

Examples of the other vinyl monomer comprising an intermediate polarity may include (meth)acrylate esters with a straight- or branched-chain structure. Concrete examples may include methyl(meth)acrylate, ethyl(meth)acrylate, n-propyl(meth)acrylate, i-propyl(meth)acrylate, n-butyl (meth)acrylate, i-butyl(meth)acrylate, t-butyl(meth)acrylate, methoxyethyl(meth)acrylate, ethoxyethyl(meth)acrylate, n-propoxyethyl(meth)acrylate, i-propoxyethyl(meth)acrylate, n-butoxyethyl(meth)acrylate, i-butoxyethyl(meth) acrylate, t-butoxyethyl(meth)acrylate, and the like. The aforementioned may be used alone, or in combinations of two or more, as necessary.

The amount of the other vinyl monomer comprising an intermediate polarity is preferably in the range of 0 to 40 mol % with respect to the total monomer component. A higher proportional content of the other vinyl monomer comprising an intermediate polarity results in greater improvement of the solubility of the resultant copolymer, which in turn reduces the amount of insoluble matter. A lower proportional content of the other vinyl monomer comprising an intermediate polarity results in greater improvement in all of the adhesion, water resistance, and thermal resistance properties of the resultant copolymer.

The polarity of the monomer is defined as the value (hereinafter, referred to as δP value) of the polarity term in the formula for the solubility parameter of a liquid, expressed by the sum of the dispersion force, polarity, and hydrogen bond terms, disclosed in J. Brandrup and E. H. Immergut, *Polymer Handbook Third Edition*, (John Wiley & Sons, Inc., 1989), section 7, pp. 519–544. This δP value generally tends to increase successively with respect to an alicyclic structure, a straight- or branched-chain structure, and a lactone structure, in that order.

When using the other vinyl monomer comprising an intermediate polarity, the amount of the monomer containing an alicyclic structure is preferably in the range of 10 to 90 mol % to the total monomer component. A higher proportional content of the monomer with an alicyclic structure results in a greater improvement in both the hydrophobic and thermal resistance properties of the resultant copolymer and resin composition. A lower proportional content of the monomer with an alicyclic structure results in a greater improvement in the adhesion properties imparted by means of the monomer containing a lactone structure.

When using the other vinyl monomer comprising an intermediate polarity, the amount of the monomer containing a lactone structure is preferably in the range of 10 to 90 mol % to the monomer component. A higher proportional content of the monomer with a lactone structure results in a greater improvement in the adhesion properties of the resultant copolymer and resin composition. A lower proportional content of the monomer with a lactone structure results in a greater improvement in both the hydrophobic and thermal resistance properties imparted by means of the monomer containing an alicyclic structure.

The weight average molecular weight of the copolymer according to the present invention is not particularly limited, however, is preferably in the range of 1,000 to 100,000. A higher weight average molecular weight results in a greater improvement in both the hydrophobic and thermal resistance properties of the resultant copolymer. A lower weight average molecular weight results in a greater improvement in the solubility to solvents for manufacturing paints, or resists, and the like.

When using the copolymer according to the present invention as a resist composition for manufacturing semiconductors, the weight average molecular weight is preferably in the range of 1,000 to 20,000. A lower weight average molecular weight results in a greater improvement in the sensitivity and resolution as a resist. In addition, a narrower molecular weight distribution results in a greater improvement in the sensitivity and resolution as a resist, and thus is more preferable. Concretely, the value of the weight average molecular weight/the number average molecular weight is preferably in the range of 1.0–1.5.

The copolymer according to the present invention can be manufactured according to a conventional method such as a solution polymerization method, emulsion polymerization method, suspension polymerization method, bulk polymerization method, and the like. Among the aforementioned, when considering the molecular weight of the resultant copolymer, the solution polymerization method is preferred.

In general, in a method for manufacturing a copolymer according to the solution polymerization method, the monomer components including the monomer containing an alicyclic structure, and monomer containing a lactone structure, and in some cases, other vinyl monomer, are dissolved in an organic solvent, to which a polymerization initiator is added, and the resultant is stirred while heating for predetermined duration.

In particular, as a method for manufacturing the copolymer according to the present invention, a method wherein a mixed solution obtained by means of dissolving, in advance, all the monomer components including the monomer containing an alicyclic structure, and monomer containing a lactone structure, and the polymerization initiator, in an organic solvent, is added dropwise to an organic solvent maintained at a predetermined temperature (i.e., dropwise polymerization method), is preferred since the copolymer composition at the initial and later stages of polymerization does not differ greatly.

The polymerization initiator used in the dropwise polymerization method is not particularly limited as long as it effectively generates radicals by means of heat. Examples of such a polymerization initiator may include azo compounds such as azobisisobutyronitrile, 2,2'-azobis(2,4-dimethylvaleronitrile), and the like; organic peroxides such as benzoyl peroxides; and the like.

The solvent used in forming the mixed solution and the solvent to which the solution is added dropwise in the dropwise polymerization method are not particularly limited, as long as they are able to dissolve all of the aforementioned monomer containing an alicyclic structure, monomer containing a lactone structure, polymerization initiator, and resultant copolymer. Examples of such solvents may include alcohols such as isopropyl alcohol, butyl alcohol, and the like; ketones such as acetone, methylethyl ketone, methylisobutyl ketone, and the like; esters such as ethyl acetate, isobutyl acetate, and the like; cellosolves such as ethyl cellosolve, butyl cellosolve, and the like; ethers such as 1,4-dioxane, tetrahydrofuran, and the like.

The polymerization temperature according to the dropwise polymerization method is determined according to the boiling point of the solvent and the decomposition temperature of the polymerization initiator used. This polymerization temperature is not particularly limited, however, is preferably in the range of 50 to 150° C. A higher polymerization temperature results in a shorter reaction time, and thus improves the productivity. A lower polymerization temperature results in greater ease in controlling the reaction.

The speed at which the aforementioned mixed solution is dropped in the dropwise polymerization method is not particularly limited, however, in general, it is preferably at a constant speed. In addition, the duration of dropwise addition is not particularly limited; however, the duration is generally at least 6 hours, and the reaction temperature is preferably maintained for approximately 2 hours after the completion of dropping, in order to complete the polymerization.

In the following, the method for using the copolymer according to the present invention is described.

After the copolymer solution manufactured according to the aforementioned method is diluted to the appropriate solution viscosity level, by means of a good solvent such as tetrahydrofuran, 1,4-dioxane, and the like, the diluted solution is added dropwise to a large amount of a bad solvent such as methanol, water, and the like, in order to obtain a precipitate. Subsequently, the precipitate is filtrated, separated, and dried sufficiently. This process is called "re-precipitation", and may be unnecessary in some cases. However, it is quite useful for removing unreacted monomers, the polymerization initiator, and the like, remaining in the polymerization solution. If these unreacted monomers remain in the solution, there is a possibility of negatively impacting their stability as paints, and the like, in addition to degrading the external appearance of the coating, and thus it is preferable to remove the unreacted monomers.

The copolymer according to the present invention exhibits a superior light transmittance with respect to 193 nm light, measured at a film thickness of 500 nm. For an ArF resist resin, the copolymer preferably possesses a light transmittance of 60% or greater, more preferably a light transmittance of 70% or greater, and even more preferably a light transmittance of 75% or greater.

Subsequently, the dried powder of the copolymer is dissolved in a solvent used for manufacturing paints, resists, and the like. The solvent is optionally selected according to the purpose, however, it is extremely difficult to select a solvent for a copolymer containing an alicyclic structure and a lactone structure, such as in the present invention, due to their extremely different polarities. In addition, the selection of the solvent is limited by reasons other than the solubility of the resin, such as uniformity of the coating, external appearance, safety, and the like.

Examples of solvents which satisfy the aforementioned conditions, when using the copolymer according to the present invention as a resist composition, include ethyl lactate, propylene glycol monomethyl ether acetate, cyclohexane, diglyme, and the like.

It is preferable to include a photo-acid generator in the resist composition containing the copolymer according to the present invention. The photo-acid generator is not particularly limited, and may be optionally selected from among compounds that are capable of serving as a photo-acid generator for a chemical amplification type resist composition. Concrete examples may include onium salt compounds, sulfone imide compounds, sulfone compounds, sulfonate compounds, quinone diazido compounds, diazide methane compounds, and the like. Among the aforementioned, onium salt compound is preferred, examples of which may include sulfonium salts, iodonium salts phosphonium salts, diazonium salts, pyridinium salts, and the like. Concrete examples of the onium salt compounds may include triphenylsulfonium triflate, triphenylsulfonium hexafluoro antimonate, triphenylsulfonium naphthalene sulfonate, (hydroxyphenyl)benzylmethylsulfonium toluene sulfonate, diphenyliodonium triflate,, diphenyliodonium pyrene sulfonate, diphenyliodonium dodecylbenzene sulfonate, diphenyliodonium hexafluoro antimonate, and the like.

According to the present invention, the photo-acid generator may be used alone, or in combinations of two or more types. The amount of the photo-acid generator may be appropriately determined according to the type of photo-acid generator selected, however, this amount is generally in the range of 0.1 to 20 parts by weight per 100 parts by weight of the copolymer, and in particular, preferably in the range of 0.5 to 10 parts by weight. A greater amount of the photo-acid generator results in more complete chemical reaction induced by means of the catalytic function of the acids generated through exposure. A smaller amount of the photo-acid generator results in a reduction in uneven coating at the application of the composition, and less scum during development.

In addition, it is preferable to include a basic substance in the resist composition containing the copolymer according to the present invention. Nitrogen-containing heterocyclic compounds and/or amide group-containing compounds are particularly preferred as the aforementioned basic substance.

Concrete examples of the nitrogen-containing heterocyclic compound may include imidazoles such as imidazole, benzimidazole, 4-methylimidazole, 4-methyl-2-phenylimidazole, and the like; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, acridine, and the like; pyrazine; pyrazole; pyridazine; quinoxaline; purine, pyrrolidine; piperidine; morpholine, 4-methylmorpholine, piperazine, 1,4-dimethylpiperazine, tetrazole, 1,4-diazabicyclo[2.2.2]octane, and the like. Preferred examples among the aforementioned include tetrazoles, diazabicyclo octanes, and piperidines.

Concrete examples of the amide-group-containing compound may include formamide, N-methylformamide, N,N-dimethylformamide, N-cyclohexylformamide, acetoamide, N-methylacetoamide, N,N-dimethylacetoamide, N-(1-adamantyl)acetoamide, propionamide, benzamide, N-acetylethanol amine, 1-acetyl-3-methylpiperidine, and the like; cyclic amides such as pyrrolidone, N-methylpyrrolidone, 1-cyclohexyl-2-pyrrolidone, ε-caprolactam, δ-valerolactam, 2-pyrrolidinone, and the like; acryl amides such as acryl amide, methacryl amide, t-butylacryl amide, N-isopropylmethacryl amide, methylenebisacryl amide, methylenebismethacryl amide, N-methylolacryl amide, N-methylolmethacryl amide, N-methoxyacryl amide, N-ethoxyacryl amide, N-butoxyacryl amide, diacetoneacryl amide, and the like; and the like. Preferred examples among the aforementioned include (meth)acryl amides and acetoamides.

The basic substance may be used alone, or in combinations of two or more. The amount of the basic substance may be appropriately determined according to the type of the basic substance selected, however, this amount is generally in the range of 0.01 to 10 mol per 1 mol of the photo-acid generator, and preferably in the range of 0.05 to 1 mol. A higher proportional content of the basic substance results in an improved form of the resist, and a lower proportional content of the basic substance results in an improvement in the sensitivity as a resist, in addition to the developing property of the exposure part.

Furthermore, various additives such as surface active agents, sensitizers, anti-halation agents, preservation stabilizers, anti-foaming agents, and the like, may be added to the chemical amplification type resist composition according to the present invention, as necessary.

EXAMPLES

In the following, the present invention is concretely described, using examples. Herein, 'parts' means 'parts by weight', unless otherwise indicated.

In addition, the measurement of the properties of the copolymer was performed, using the following method.

<Weight Average Molecular Weight>

The weight average molecular weight was expressed in terms of polymethyl methacrylate, by means of gel permeation chromatography (GPC). Chloroform was used as a solvent.

<Average Copolymer Composition of the Monomer Containing a Lactone Structure (mol %)>

The average copolymer composition of the monomer containing a lactone structure was identified by means of $^1$H-NMR of the copolymer. Chloroform-$d_1$ was used as a solvent.

<Distribution of the Copolymer Composition of the Monomer Containing a Lactone Structure>

The copolymer was dissolved in chloroform, and the resultant solution was separated into 10 fractions by means of GPC. Thereafter, the $^1$H-NMR of each fraction was measured to identify the copolymer composition of the monomer containing a lactone structure in the copolymer. The highest copolymer composition of the monomer containing a lactone structure was recorded as the maximum composition (mol %), and the lowest copolymer composition of the monomer containing a lactone structure was recorded as the minimum composition (mol %).

<Solubility>

1 part of the copolymer was added to 7 parts of ethyl lactate or 7 parts of propylene glycol monomethyl ether acetate, and the resultant mixture was stirred for 2 hours at a room temperature to observe the state of the solution. A clear solution in which no insoluble matter was found is indicated by means of the symbol O; and an unclear solution in which insoluble matter was found is indicated by means of the symbol ×.

<Light Transmittance>

A sample of the copolymer was applied to a silicone substrate to form a film thickness (d) of 500 nm, and the complex refractive index of the copolymer (refractive index: n; and attenuation coefficient: k) was measured with respect to an exposure wavelength (λ) of 193 nm, using a spectral elipsometer. From the measuring conditions and results, the transmittance ($I/I_0$) was calculated, using the following formula (wherein, $I/I_0$ was multiplied by 100 when the transmittance was expressed as a percentage.)

$$I/I_0 = \exp(-4\pi dk/\lambda)$$

Example 1

20.0 parts of 1,4-dioxane was added under a nitrogen atmosphere to a flask provided with a nitrogen introduction port, stirrer, condenser, and thermometer, and the temperature of the hot bath was raised to 80° C. while stirring. A mixed monomer solution comprising 27.8 parts of 1-isobornylmethacrylate, (which is 50 mol % to the total monomer component), 24.8 parts of β-methacryloyloxy-β-methyl-δ-valerolactone (in an amount of 50 mol % to the total monomer component), 62.5 parts of 1,4-dioxane, and 1.9 parts of azobisisobutyronitrile was added dropwise to the flask at a constant speed for 6 hours, and the temperature of 80° C. was maintained for 2 hours. Subsequently, the resultant reaction solution was diluted by approximately one-half using tetrahydrofuran, and then added dropwise to approximately 10 times the aforementioned amount of methanol while stirring, to yield a white precipitate (copolymer A). The resultant precipitate was filtrated, separated, and dried at 60° C. under reduced pressure for approximately 40 hours. Each property of the copolymer A was measured, and the results are shown in Table 1.

Examples 2 to 8

The copolymers B to H were obtained in the same manner as in Example 1, with the exception of changing the monomers and their preparation amounts according to Table 1, without changing the total mol number of these monomers. Each property of the resultant copolymers B to H was measured, and the results are shown in Table 1.

TABLE 1

|  |  | Examples | | | | | | | |
|---|---|---|---|---|---|---|---|---|---|
|  |  | 1 | 2 | 3 | 4 | 5 | 6 | 7 | 8 |
| Copolymer |  | A | B | C | D | E | F | G | H |
| Monomer containing an alicyclic structure (parts by weight) | IBX | 27.8 | — | — | — | — | — | — | — |
|  | MAdMA | — | 29.3 | 29.3 | 29.3 | 29.3 | 29.3 | 32.2 | 25.2 |
| Monomer containing a lactone structure (parts by weight) | MLMA | 24.8 | 24.8 | — | — | — | — | 22.3 | — |
|  | HGBMA | — | — | 21.2 | — | — | — | — | 24.2 |
|  | MBLMA | — | — | — | 23.0 | — | — | — | — |
|  | GBLMA | — | — | — | — | 21.2 | — | — | — |
|  | BLEMA | — | — | — | — | — | 24.8 | — | — |
| Weight average molecular weight |  | 15000 | 12000 | 11000 | 15000 | 17000 | 12000 | 7000 | 7500 |
| Copolymer composition of monomer containing a lactone structure (mol %) | Average | 50 | 49 | 50 | 51 | 52 | 49 | 45 | 57 |
|  | Maximum | 55 | 52 | 51 | 57 | 58 | 51 | 50 | 63 |
|  | Minimum | 45 | 46 | 50 | 44 | 44 | 47 | 40 | 50 |
| Solubility | EL | O | O | O | O | O | O | O | O |
|  | PGMEA | O | O | O | O | O | O | O | O |
| Light transmittance (%) |  |  |  |  |  |  |  |  | 79.7 |

IBX: 1-isobornyl methacrylate
MAdMA: 2-methacryloyloxy-2-methyl adamantane
MLMA: β-methacryloyloxy-β-methyl-δ-valerolactone
HGBMA: β-methacryloyloxy-γ-butyrolactone
MBLMA: β-methacryloyloxy-β-methyl-γ-butyrolactone
GBLMA: α-methacryloyloxy-γ-butyrolactone
BLEMA: 2-(1-methacryloyloxy)ethyl-4-butanolide
EL: ethyl lactate
PGMEA: propylene glycol monomethyl ether acetate Example 9

22.8 parts of 1-isobornylmethacrylate (41 mol % of the total monomer component), 20.3 parts of β-methacryloyloxy-β-methyl-δ-valerolactone (41 mol % of the total monomer component), 4.5 parts of methylmethacrylate (18 mol % of the total monomer component), 82.5 parts of 1,4-dioxane, and 3.8 parts of azobisisobutyronitrile were all added under a nitrogen atmosphere to a flask provided with a nitrogen introduction port, stirrer, condenser, and thermometer, and the temperature of the hot bath was raised to 80° C. while stirring. The polymerization was performed at the above temperature for 8 hours. Subsequently, the resultant reaction solution was diluted with tetrahydrofuran by approximately one-half, and then-added dropwise to approximately 10 times the aforementioned amount of methanol while stirring, to yield a white precipitate (copolymer 1). The resultant precipitate was filtrated, separated, and dried at 60° C. under reduced pressure for approximately 40 hours. Each property of the copolymer I was measured, and the results are shown in Table 2.

Examples 10 to 14

The copolymers J to N were obtained in the same manner as in Example 9, with the exception of changing the monomers and their preparation amounts according to Table 2, without changing the total mol number of these monomers. Each property of the resultant copolymers J to N was measured, and the results are shown in Table 2.

added under a nitrogen atmosphere to a flask provided with a nitrogen introduction port, stirrer, condenser, and thermometer, and the temperature of the hot bath was raised to 80° C. while stirring. The polymerization was performed at the aforementioned temperature for 8 hours. Subsequently, the resultant reaction solution was diluted with tetrahydrofuran by approximately one-half, and then added dropwise to approximately 10 times the aforementioned amount of methanol while stirring, to yield a white precipitate (copolymer O). The resultant precipitate was filtrated, separated, and dried at 60° C. under reduced pressure for approximately 40 hours. Each property of the copolymer O was measured, and the results are shown in Table 3.

Comparative Examples 2 to 6

The copolymers P to T were obtained in the same manner as in Comparative Example 1, with the exception of chang-

TABLE 2

| | | Example | | | | | |
|---|---|---|---|---|---|---|---|
| | | 9 | 10 | 11 | 12 | 13 | 14 |
| Copolymer | | I | J | K | L | M | N |
| Monomer containing an alicyclic structure (mol %) | IBX | 41 | — | — | — | — | — |
| | MAdMA | — | 41 | 41 | 41 | 41 | 41 |
| Monomer containing a lactone structure (mol %) | MLMA | 41 | 41 | — | — | — | — |
| | HGBMA | — | — | 41 | — | — | — |
| | MBLMA | — | — | — | 41 | — | — |
| | GBLMA | — | — | — | — | 41 | — |
| | BLEMA | — | — | — | — | — | 41 |
| Other vinyl monomers (mol %) | MMA | 18 | 18 | 18 | 18 | — | — |
| | EEMA | — | — | — | — | 18 | 18 |
| Weight average molecular weight | | 15000 | 12000 | 14000 | 15000 | 18000 | 16000 |
| Solubility | EL | ○ | ○ | ○ | ○ | ○ | ○ |
| | PGMEA | ○ | ○ | ○ | ○ | ○ | ○ |

IBX: 1-isobornyl methacrylate
MAdMA: 2-methacryloyloxy-2-methyl adamantane
MLMA: β-methacryloyloxy-β-methyl-δ-valerolactone
HGBMA: β-methacryloyloxy-γ-butyrolactone
MBLMA: β-methacryloyloxy-β-methyl-γ-butyrolactone
GBLMA: α-methacryloyloxy-γ-butyrolactone
BLEMA: 2-(1-methacryloyloxy)ethyl-4-butanolide
MMA: methylmethacrylate
EEMA: 1-ethoxyethylmethacrylate
EL: ethyl lactate
PGMEA: propylene glycol monomethyl ether acetate Comparative Example 1

27.8 parts of 1-isobornylmethacrylate, 24.8 parts of β-methacryloyloxy-β-methyl-δ-valerolactone, 82.5 parts of 1,4-dioxane, and 3.8 parts of azobisisobutyronitrile were all ing the monomers and their preparation amounts according to Table 3, without changing the total mol number of these monomers. Each property of the resultant copolymers P to T was measured, and the results are shown in Table 3.

TABLE 3

| | | Comparative Example | | | | | |
|---|---|---|---|---|---|---|---|
| | | 1 | 2 | 3 | 4 | 5 | 6 |
| Copolymer | | O | P | Q | R | S | T |
| Monomer containing an alicyclic structure (parts by weight) | IBX | 27.8 | — | — | — | — | — |
| | MAdMA | — | 29.3 | 29.3 | 29.3 | 29.3 | 29.3 |
| Monomer containing a lactone structure (parts by weight) | MLMA | 24.8 | 24.8 | — | — | — | — |
| | HGBMA | — | — | 21.2 | — | — | — |
| | MBLMA | — | — | — | 23.0 | — | — |
| | GBLMA | — | — | — | — | 21.2 | — |
| | BLEMA | — | — | — | — | — | 24.8 |
| Weight average molecular weight | | 18000 | 15000 | 14000 | 16000 | 17000 | 12000 |
| Copolymer composition of monomer containing a lactone structure (mol %) | Average | 50 | 49 | 50 | 51 | 52 | 49 |
| | Maximum | 73 | 70 | 68 | 68 | 70 | 66 |
| | Minimuin | 30 | 35 | 38 | 34 | 34 | 32 |

TABLE 3-continued

|  |  | Comparative Example | | | | | |
| --- | --- | --- | --- | --- | --- | --- | --- |
|  |  | 1 | 2 | 3 | 4 | 5 | 6 |
| Solubility | EL | x | x | x | x | x | x |
|  | PGMEA | x | x | x | x | x | x |

IBX: 1-isobornyl methacrylate
MAdMA: 2-methacryloyloxy-2-methyl adamantane
MLMA: β-methacryloyloxy-β-methyl-δ-valerolactone
HGBMA: β-methacryloyloxy-γ-butyrolactone
MBLMA: β-methacryloyloxy-β-methyl-γ-butyrolactone
GBLMA: α-methacryloyloxy-γ-butyrolactone
BLEMA: 2-(1-methacryloyloxy)ethyl-4-butanolide
EL: ethyl lactate
PGMEA: propylene glycol monomethyl ether acetate

Industrial Applicability

As described in the aforementioned, the copolymer according to the present invention, which can be obtained by means of polymerizing a monomer containing an alicyclic structure, and a monomer containing a lactone structure, wherein the distribution of the copolymer composition of the monomer containing a lactone structure in the copolymer is in the range of −10 to +10 mol % of the average copolymer composition of said monomer containing a lactone structure, exhibits superior adhesion properties to surfaces possessing a high polarity, such as metal surfaces and the like, in addition to superior hydrophobic and thermal resistance properties, and further imparts a favorable solubility in solvents used for manufacturing paints, resists, and the like.

The copolymer according to the present invention, which can be obtained by means of polymerizing a monomer containing an alicyclic structure, a monomer containing a lactone structure, and another vinyl monomer, wherein said other vinyl monomer possesses a higher polarity than said monomer containing an alicyclic structure, but a lower polarity than said monomer containing a lactone structure, exhibits superior adhesion properties to surfaces possessing a high polarity, such as metal surfaces, in addition to superior hydrophobic and thermal resistance properties, and imparts a favorable solubility in solvents used for manufacturing paints, resists, and the like.

The copolymer according to the present invention can be manufactured according to a method for manufacturing the copolymer of the present invention, wherein a mixed solution comprising the monomer components including a monomer containing an alicyclic structure, and a monomer containing a lactone structure; polymerization initiator; and solvent, is added dropwise to a solvent which has been heated to the polymerization temperature.

Furthermore, the resist composition for manufacturing semiconductors, which contains the copolymer according to the present invention, imparts superior uniformity, sensitivity, and resolution. In addition, the copolymer according to the present invention is superior as an ArF resist resin, since it possesses a superior transparency with respect to an ArF excimer laser (at a wavelength of 193 nm).

What is claimed is:

1. A copolymer obtained by means of polymerizing by adding dropwise a mixed solution comprising a monomer component comprising at least one monomer containing an alicyclic structure and a monomer containing a lactone structure; a polymerization initiator; and a solvent to a solvent heated to a polymerization temperature, wherein the distribution of the copolymer composition of said monomer containing a lactone structure in said copolymer is in the range of −10 to +10 mol % of the average copolymer composition of said monomer containing a lactone structure in said entire copolymer.

2. A copolymer according to claim 1, wherein said monomer containing an alicyclic structure comprises at least one monomer selected from among the group consisting of cyclohexyl(meth)acrylate, isobornyl(meth)acrylate, adamantyl(meth)acrylate, tricyclodecanyl(meth)acrylate, dicyclopentadienyl(meth)acrylate, and substitution products thereof.

3. A copolymer according to claim 1, wherein said monomer containing a lactone structure comprises at least one monomer selected from along the group consisting of substituted and unsubstituted (meth)acrylates containing a δ-valerolactone ring, and substituted and unsubstituted monomers containing a γ-butyrolactone ring.

4. A copolymer according to claim 2, wherein said monomer containing a lactone structure comprises at least one monomer selected from among the group consisting of substituted and unsubstituted (meth)acrylates containing a δ-valerolactone ring, and substituted and unsubstituted monomers containing a γ-butyrolactone ring.

5. A copolymer according to claim 1 obtained by means of polymerizing a monomer containing an alicyclic structure, monomer containing a lactone structure, and another vinyl monomer, wherein said other vinyl monomer possesses a higher polarity than said monomer containing an alicyclic structure, but a lower polarity than said monomer containing a lactone structure.

6. A copolymer according to claim 5, wherein said monomer containing an alicyclic structure comprises at least one monomer selected from among the group consisting of cyclohexyl(meth)acrylate, isobornyl(meth)acrylate, adamantyl(meth)acrylate, tricyclodecanyl(meth)acrylate, dicyclopentadienyl(meth)acrylate, and substitution products thereof.

7. A copolymer according to claim 5, wherein said monomer containing a lactone structure comprises at least one monomer selected from among the group consisting of substituted and unsubstituted (meth)acrylates containing a δ-valerolactone ring, and substituted and unsubstituted monomers containing a γ-butyrolactone ring.

8. A copolymer according to claim 6, wherein said monomer containing a lactone structure comprises at least one monomer selected from among the group consisting of substituted and unsubstituted (meth)acrylates containing a δ-valerolactone ring, and substituted and unsubstituted monomers containing a γ-butyrolactone ring.

9. A copolymer according to claim 1 obtained by means of polymerizing a monomer containing an alicyclic structure, and a substituted or unsubstituted (meth)acrylate containing a γ-butyrolactone ring.

10. A copolymer according to claim 9, wherein said monomer containing an alicyclic structure comprises at least one monomer selected from among the group consisting of cyclohexyl(meth)acrylate, isobornyl(meth)acrylate, adamantyl(meth)acrylate, tricyclodecanyl(meth)acrylate, dicyclopentadienyl(meth)acrylate, and substitution products thereof.

11. A copolymer according to claim 1 obtained by means of polymerizing a monomer containing an alicyclic structure, a substituted or unsubstituted (meth)acrylate containing a γ-butyrolactone ring, and another vinyl monomer.

12. A copolymer according to claim 11, wherein said monomer containing an alicyclic structure comprises at least one monomer selected from among the group consisting of cyclohexyl(meth)acrylate, isobornyl(meth)acrylate, adamantyl(meth)acrylate, tricyclodecanyl(meth)acrylate, dicyclopentadienyl(meth)acrylate, and substitution products thereof.

13. A method for manufacturing a copolymer according to claim 1 comprising the step of adding dropwise a mixed solution comprising a monomer component comprising at least one monomer containing an alicyclic structure and a monomer containing a lactone structure; a polymerization initiator; and a solvent to a solvent heated to a polymerization temperature.

14. A resist composition comprising a copolymer according to claim 1.

15. A resist composition according to claim 14, characterized in comprising a nitrogen-containing heterocyclic compound, or an amide group-containing compound.

16. A resist composition according to claim 14, characterized in containing a photo-acid generator.

17. A resist composition according to claim 15, characterized in containing a photo-acid generator.

18. A copolymer according to claim 1, wherein the 198 nm light transmittance is 60% or greater, when measured at a film thickness of 500 nm.

* * * * *